(12) United States Patent
Winkler et al.

(10) Patent No.: US 11,192,777 B2
(45) Date of Patent: Dec. 7, 2021

(54) MEMS SENSOR PACKAGE SYSTEMS AND METHODS

(71) Applicant: Infineon Technologies AG, Neubiberg (DE)

(72) Inventors: Bernhard Winkler, Regensburg (DE); Rainer Leuschner, Regensburg (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 11 days.

(21) Appl. No.: 15/864,787

(22) Filed: Jan. 8, 2018

(65) Prior Publication Data

US 2018/0127267 A1    May 10, 2018

Related U.S. Application Data

(63) Continuation of application No. 14/136,199, filed on Dec. 20, 2013, now Pat. No. 9,884,757, which is a
(Continued)

(51) Int. Cl.
*B81B 7/00* (2006.01)
*G01L 9/00* (2006.01)
(Continued)

(52) U.S. Cl.
CPC .......... *B81B 7/0058* (2013.01); *G01L 9/0054* (2013.01); *G01L 15/00* (2013.01);
(Continued)

(58) Field of Classification Search
CPC ............ B81B 7/0058; B81B 2201/025; B81B 2201/0264; B81B 2207/012; B81B 2207/015; G01L 9/0054; G01L 15/00; G01L 19/148; G01L 19/141; H01L 29/84; H01L 2924/181; H01L 2924/1461;
(Continued)

(56) References Cited

U.S. PATENT DOCUMENTS 6,379,988 B1 * 4/2002 Peterson ............. B81C 1/00333
257/E21.502
6,401,545 B1   6/2002 Monk et al.
(Continued)

FOREIGN PATENT DOCUMENTS

DE   19707503 A1   8/1998
DE   101 27 655 A1   1/2003
(Continued)

OTHER PUBLICATIONS

Office Action dated Mar. 16, 2018 for German Application No. 102011078937.5.

*Primary Examiner* — Patricia D Reddington
(74) *Attorney, Agent, or Firm* — Schiff Hardin LLP

(57) ABSTRACT

Embodiments relate to sensor and sensing devices, systems and methods. In an embodiment, a micro-electromechanical system (MEMS) device comprises at least one sensor element; a framing element disposed around the at least one sensor element; at least one port defined by the framing element, the at least one port configured to expose at least a portion of the at least one sensor element to an ambient environment; and a thin layer disposed in the at least one port.

21 Claims, 11 Drawing Sheets

Related U.S. Application Data continuation of application No. 12/835,111, filed on Jul. 13, 2010, now Pat. No. 8,618,620.

(51) Int. Cl.
  *G01L 15/00* (2006.01)
  *G01L 19/14* (2006.01)
  *H01L 29/84* (2006.01)
  *H01L 23/31* (2006.01)
  *H01L 21/56* (2006.01)

(52) U.S. Cl.
  CPC .......... *G01L 19/141* (2013.01); *G01L 19/148* (2013.01); *H01L 29/84* (2013.01); *B81B 2201/025* (2013.01); *B81B 2201/0264* (2013.01); *B81B 2207/012* (2013.01); *B81B 2207/015* (2013.01); *B81C 2203/0154* (2013.01); *H01L 21/56* (2013.01); *H01L 23/3157* (2013.01); *H01L 2224/48091* (2013.01); *H01L 2224/48137* (2013.01); *H01L 2224/48247* (2013.01); *H01L 2224/48465* (2013.01); *H01L 2924/1461* (2013.01); *H01L 2924/181* (2013.01); *H01L 2924/1815* (2013.01)

(58) Field of Classification Search
  CPC . H01L 2224/48091; H01L 2224/48137; H01L 2224/48247; H01L 2224/48465; H01L 2924/1815; H01L 23/3157; H01L 21/56; B81C 2203/0154
  See application file for complete search history.

(56) References Cited

U.S. PATENT DOCUMENTS

| 6,732,590 B1* | 5/2004 | Gottlieb | G01L 19/147 73/754 |
|---|---|---|---|
| 7,781,852 B1 | 8/2010 | Faheem et al. | |
| 8,618,620 B2 | 12/2013 | Winkler et al. | |
| 2004/0080029 A1 | 4/2004 | Chow et al. | |
| 2006/0103487 A1 | 5/2006 | Huynh | |
| 2006/0119453 A1 | 6/2006 | Fattinger et al. | |
| 2007/0069354 A1* | 3/2007 | Dangelmaier | B81B 7/0058 257/678 |
| 2007/0090473 A1* | 4/2007 | Engling | B81B 7/0058 257/414 |
| 2009/0001553 A1 | 1/2009 | Pahl et al. | |
| 2009/0020862 A1 | 1/2009 | Chen et al. | |
| 2009/0027869 A1 | 1/2009 | Uchida et al. | |
| 2009/0091022 A1* | 4/2009 | Meyer | H01L 21/561 257/723 |
| 2009/0115008 A1 | 5/2009 | Ziglioli et al. | |
| 2009/0206467 A1 | 8/2009 | Raben | |
| 2010/0171189 A1 | 7/2010 | Liu | |
| 2010/0199777 A1* | 8/2010 | Hooper | G01L 19/0084 73/721 |
| 2010/0275675 A1* | 11/2010 | Seppa | G01L 9/0041 73/24.01 |
| 2011/0036174 A1* | 2/2011 | Hooper | B81B 7/0061 73/721 |
| 2011/0057273 A1 | 3/2011 | O'Donnell et al. | |

FOREIGN PATENT DOCUMENTS

| DE | 10130084 A1 | 1/2003 |
|---|---|---|
| DE | 102 06 919 A1 | 8/2003 |
| DE | 102005054177 A1 | 5/2007 |
| EP | 1602625 A1 | 12/2005 |
| EP | 1739829 A2 | 1/2007 |
| EP | 1 772 961 A2 | 4/2007 |
| EP | 1 575 165 B1 | 5/2008 |
| EP | 1998445 A2 | 12/2008 |
| JP | 11017490 A | 1/1999 |
| WO | WO-98/29942 A1 | 7/1998 |
| WO | WO-03/043188 A1 | 5/2003 |
| WO | WO-2006/024262 A1 | 3/2006 |
| WO | WO-2008148736 A2 | 12/2008 |
| WO | WO-2009/071637 A3 | 11/2009 |
| WO | 2010/113712 A1 | 10/2010 |

\* cited by examiner

MEMS SENSOR PACKAGE SYSTEMS AND METHODS

RELATED APPLICATION

This application is a continuation of application Ser. No. 14/136,199 filed Dec. 20, 2013, which is a continuation of application Ser. No. 12/835,111 filed Jul. 13, 2010, now U.S. Pat. No. 8,618,620, each of which is incorporated herein by reference in its entirety.

TECHNICAL FIELD

The invention relates generally to integrated circuit (IC) packaging and more particularly to micro-electromechanical systems (MEMS) packages having one or more ports.

BACKGROUND

Integrated circuit micro-electromechanical system (MEMS) devices can require specialized packages or packaging processes. Some MEMS devices, such as pressure sensors, often require specialized packaging solutions to accommodate one or more external pressure ports because at least a portion of the sensor chip surface needs to be exposed to the ambient environment without the common protection of mold compound and/or a package wall. On the other hand, bond pads and bond wires of the sensor die present critical challenges with respect to external media compatibility and need adequate protection. These opposing needs present challenges for the design of package solutions, often leading to specialized solutions that are not standardized, necessitating changes to the wafer and assembly processes that are complicated and expensive.

For example, conventional MEMS pressure sensors often have a premolded cavity package, with the cavity opened or exposed on one side for the sensor die and bond wires. The chip surface with the sensing element faces the open portion of the cavity package. The sensor die and bond wires can be covered with a gel or other suitable material filled into the cavity package to protect the bond pads, bond wires and the sensing elements from external media. One disadvantage of such a conventional package design is that the gel often cannot provide adequate protection against aggressive media. As previously mentioned, this is most critical for the sensitive bond pads and bond wires. Another disadvantage is the relatively high material cost for the premolded package, leading to higher product cost. Further, this package type is not compatible with relative pressure sensor applications, discussed in more detail below.

Another conventional solution is to use a standard leadframe and to form a cavity during the mold process with a specially shaped mold tool. In this case the sensor die bonding into the formed cavity and the wire bonding are done after the mold process. This approach also usually requires a protective gel on the sensor die. The previously mentioned disadvantages relating to media compatibility and the incompatibility for relative pressure sensor applications are also applicable here.

Yet another package solution is to use a leadframe with a predefined pressure port in combination with a specially shaped mold tool to create a pressure port, for example at the backside of the package. In this case the sensing element faces the backside of the sensor chip in order to create a pressure port by attaching the sensor die with the sensing element on top of the pressure port in the package backside. The bond pads and the bond wires on the frontside of the chip can be covered with the mold compound. A disadvantage of this approach is a higher package cost compared with that of a standard package. Special and cost-intensive MEMS processes are required at the wafer process to create the MEMS structure with the backside opening on the sensor die. Absolute and relative pressure sensing applications require different wafer and assembly processes in this case, which is not desired.

SUMMARY

Embodiments relate to sensor and sensing devices, systems and methods. In an embodiment, a micro-electromechanical system (MEMS) device comprises at least one sensor element; a framing element disposed around the at least one sensor element; at least one port defined by the framing element, the at least one port configured to expose at least a portion of the at least one sensor element to an ambient environment; and a thin layer disposed in the at least one port.

BRIEF DESCRIPTION OF THE DRAWINGS

The invention may be more completely understood in consideration of the following detailed description of various embodiments of the invention in connection with the accompanying drawings, in which.

Figure 1A:
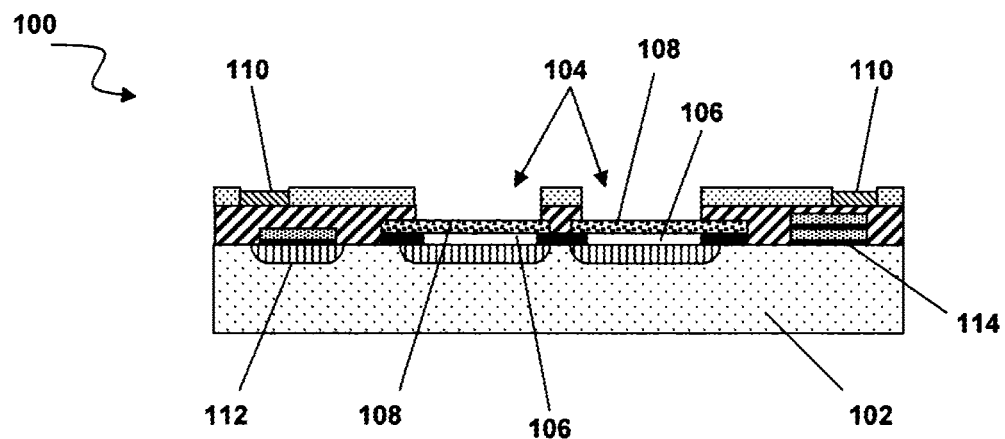
FIG. 1A is a cross-sectional view of an absolute pressure sensor during fabrication according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments of the invention relate to packages and packaging methods for IC sensors. In particular, embodiments can provide standardized and low-cost package solutions for MEMS pressure sensors, improving media compatibility and covering a wider range of sensor applications. Standardized package and packaging methods and processes in the assembly line are made possible at least in part by predefining a pressure port for the pressure sensing element at the wafer-level process before assembly, thereby enabling use of standard package solutions, mold tools and assembly lines and processes.

In one embodiment, the bond pads and bond wires of the IC sensor are covered and thus protected by a mold compound, similar to ICs in a standard package, while the predefined pressure port exposes necessary portions of the sensor to provide operability. The sensor device at the pressure port of the package is typically the only portion of the chip surface exposed to the environment. Because the sensor device itself is usually less sensitive to environmental conditions, the media compatibility of the pressure sensor is improved. To further improve the media compatibility, the package concept can be combined with additional features like a protective gel over the sensor device in the pressure port to avoid, for example, moisture, frozen media, debris and mechanical impact on the sensor membrane.

Embodiments also relate to relative pressure sensing, in which two pressure ports can be achieved by implementing at least two sensing elements with appropriate positioning on the chip surface and the corresponding predefined pressure ports. The wafer and assembly processes can be the same as for absolute pressure sensor embodiments having a single pressure port. An advantage for relative pressure sensor applications according to this approach is that the major impact of the package stress on the output signal is eliminated due to the fact that the two sensing elements corresponding to the different pressure ports are implemented in a differential signal processing scheme in order to measure only the differential pressure. Because both sensing elements are exposed to a similar mechanical stress level, the corresponding signal-shift is eliminated in the relative pressure signal output. Another advantage is that a wider range of sensor applications can be implemented with a common wafer technology and assembly line platform.

Embodiments also have applicability to other sensor applications. For example, optical sensors can also have a port or aperture in the sensor package and thereby benefit from embodiments disclosed herein. Therefore, the pressure sensing embodiments discussed herein are not limiting.

Figure 1B:
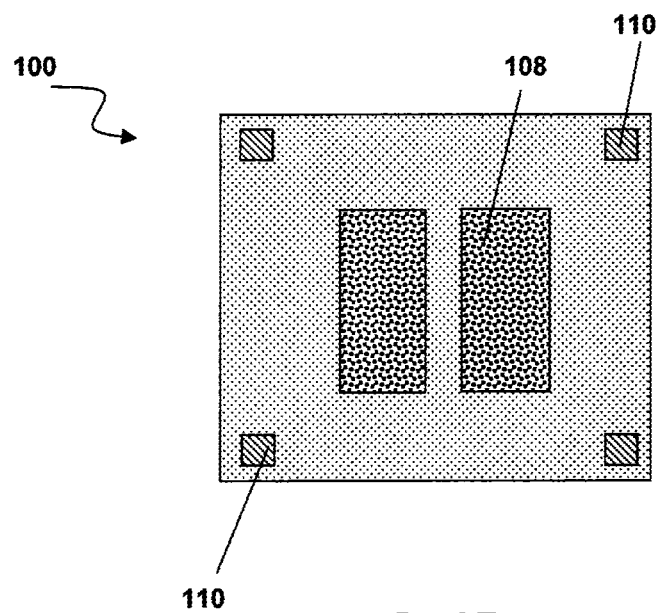
FIG. 1B is a top view of the sensor of FIG. 1A.

FIGS. 1-7 depict fabrication stages of an embodiment of an absolute pressure sensor 100. Referring to FIG. 1, sensor 100 comprises a sensor die 102 having at least one pressure sensing device 104. Each pressure sensing device 104 includes a cavity 106 and a membrane 108. Die 102 includes bond pads 110 and, optionally, other electrical devices such as transistors 112, resistors and/or capacitors 114. At this stage, sensor 100 can be similar to or the same as conventional sensor devices.

Figure 2A:
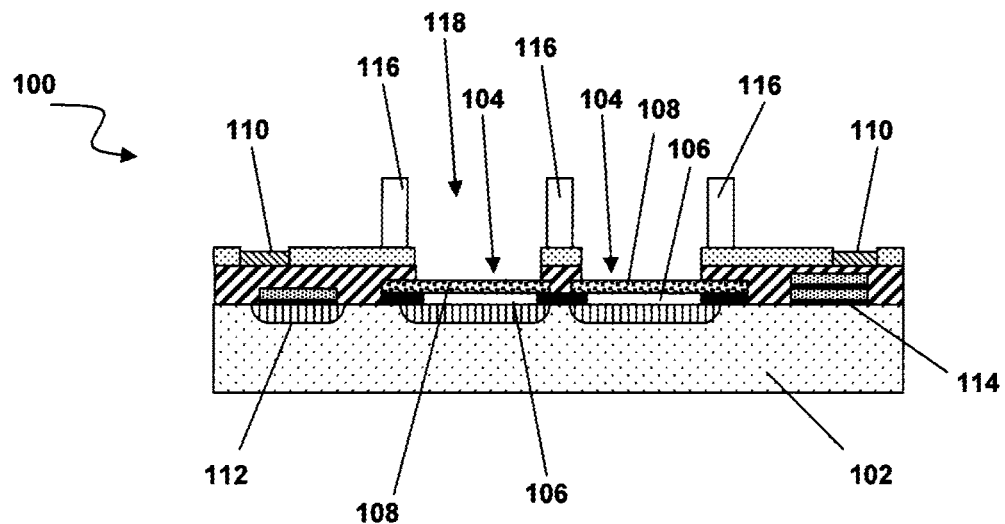
FIG. 2A is a cross-sectional view of an absolute pressure sensor during fabrication according to an embodiment.
Figure 2B:
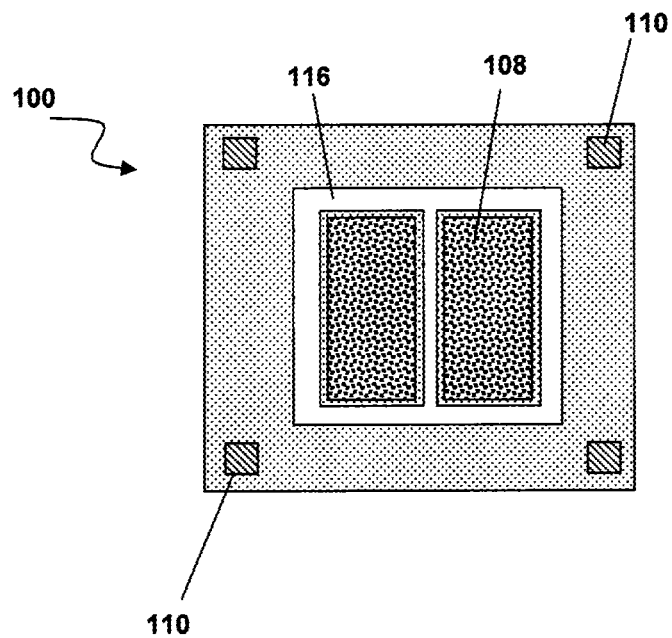
FIG. 2B is a top view of the sensor of FIG. 2A.

In FIG. 2, however, sensor 100 is modified to comprise a frame 116 fabricated during the wafer process. Frame 116 establishes a predefined pressure port 118 by creating a tight structure, protecting the active membrane structure of sensing device 104, as discussed in more detail below. Frame 116 can comprise a polymer or other suitable material, and pressure port 118 can comprise a polymer and have vertical dimensions (with respect to the orientation of the drawing on the page) in the range of about 100 micrometers (μm) to about 500 μm in embodiments. A fabrication process for pressure port 118 can be a wafer-coating with a photosensitive epoxy lacquer and subsequent photolithography steps for patterning the pressure port structure in an embodiment, though other processes can be used in other embodiments. For example, in an embodiment the pressure port material comprises a polymer and can be patterned by photolithography with an etch process omitted given the polymer material properties. Preparing sensor 100 with frame 116 at the wafer level enables use of a standard IC assembly line and package solution for sensor 100.

Figure 3:
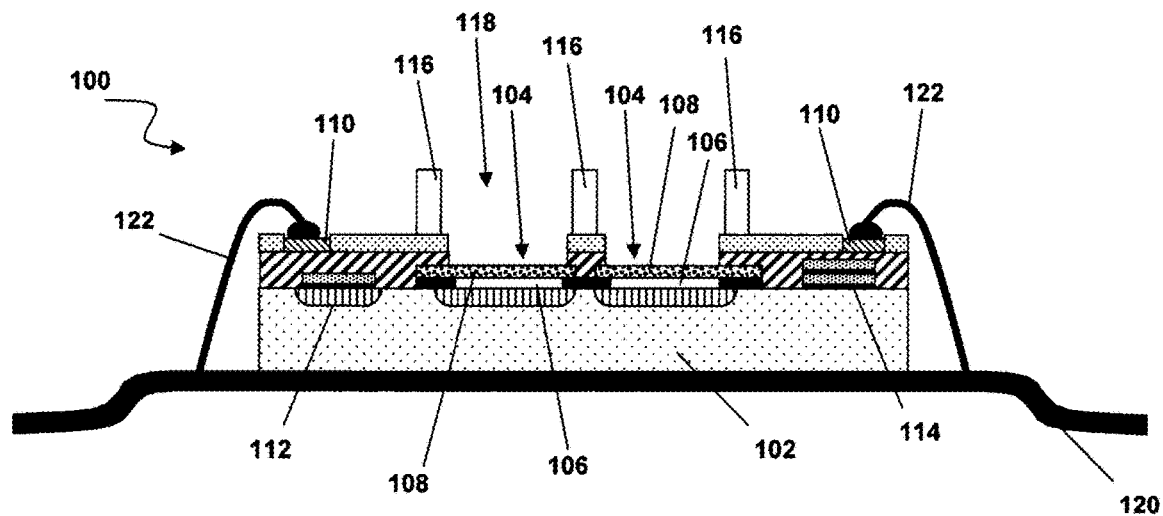
FIG. 3 is a cross-sectional view of an absolute pressure sensor during fabrication according to an embodiment.

In FIG. 3, sensor 100 is shown die-attached to leadframe 120. Leadframe 120 is coupled by wire bonds 122 to bond pads 110. Other coupling means and mechanisms can be used in other embodiments, as appreciated by those skilled in the art.

Figure 4A:
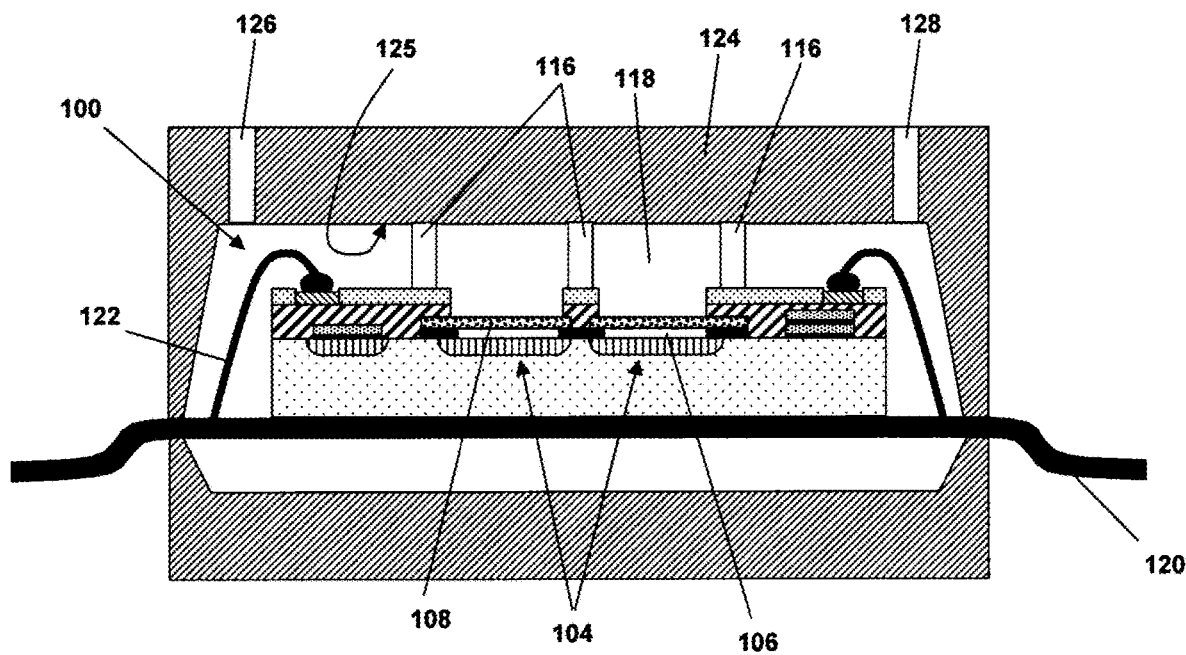
FIGS. 4A and 4B are cross-sectional views of an absolute pressure sensor in a mold tool according to an embodiment.
Figure 4B:
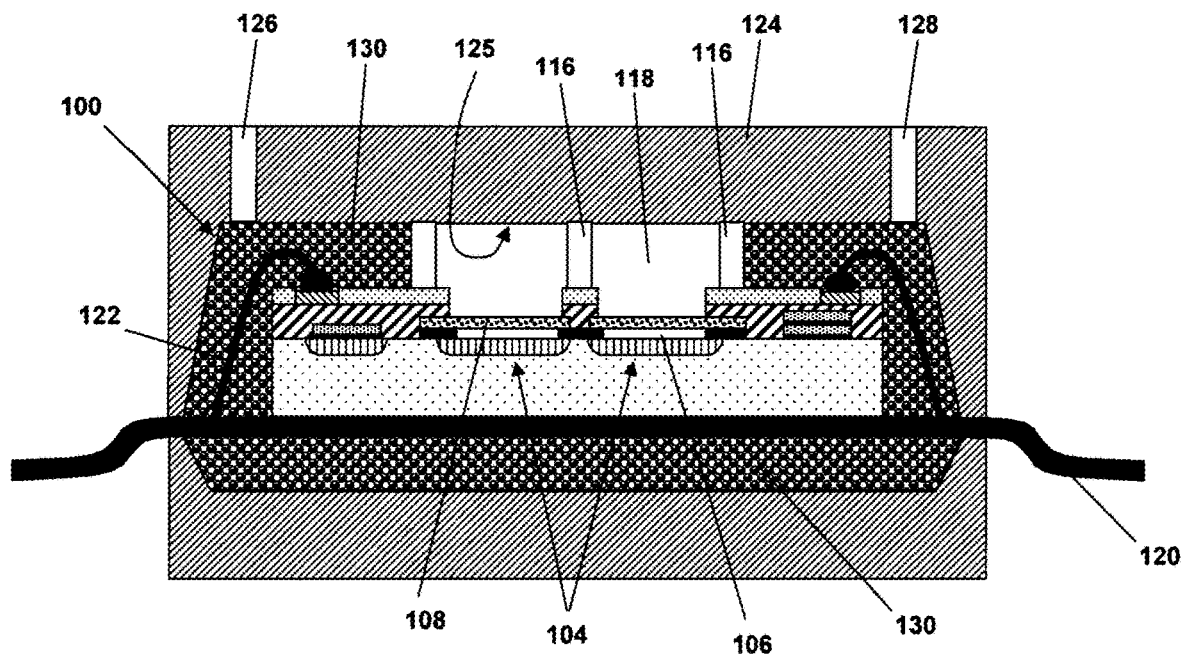

FIG. 4 depicts stages of a mold process. In FIG. 4A, sensor 100 is depicted within a mold tool 124. Mold tool 124 comprises an inlet 126 for a mold compound and an outlet 128 for air. In other embodiments, the positions and configurations of inlet 126 and outlet 128 can vary. Embodiments having frame 116 and predefined pressure ports enable use of standard rather than customized mold tools. As can be seen in FIG. 4, the top of frame 116 seals against an inner surface 125 of mold tool 124 during the mold process such that mold compound cannot enter predefined pressure ports 118. In FIG. 4B, a mold compound 130 has been filled into mold tool 124, enclosing and protecting sensor 100 and bond wires 122 while leaving the chip surface at pressure port 118 exposed.

Figure 5A:
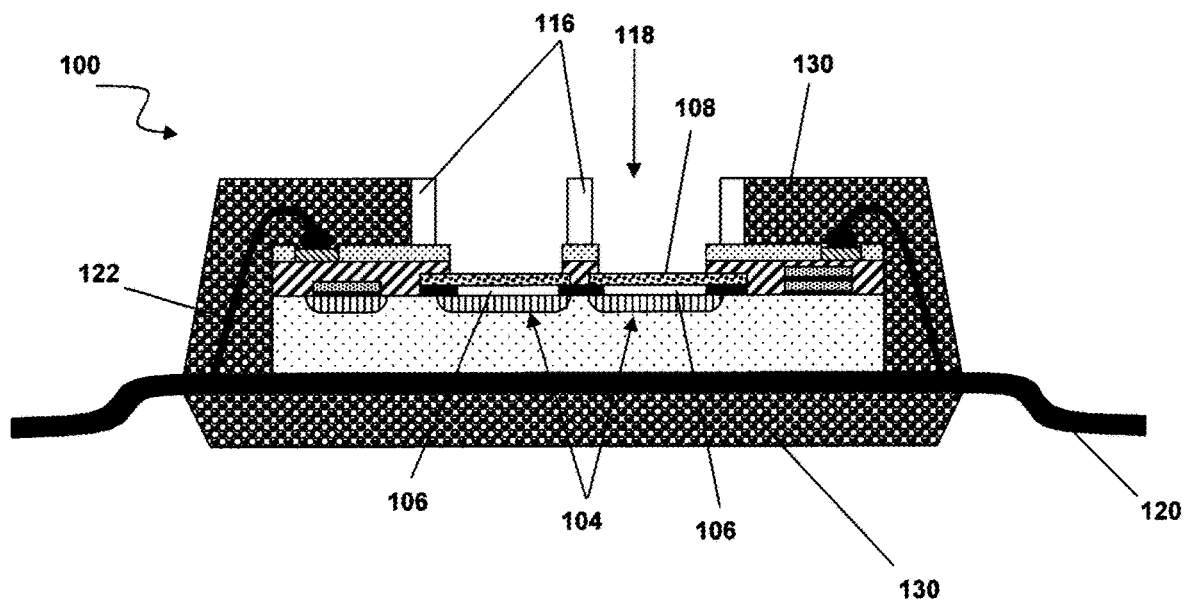
FIG. 5A is a cross-sectional view of an absolute pressure sensor according to an embodiment.
Figure 5B:
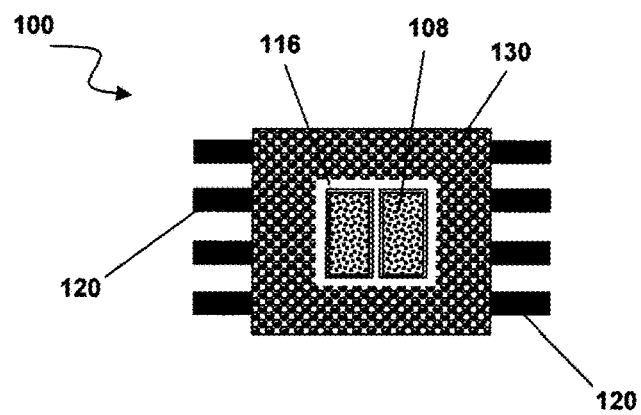
FIG. 5B is a top view of the sensor of FIG. 5A.

FIG. 5 depicts sensor 100 with mold tool 124 removed. Sensor 110 is now enclosed, or "packaged," by mold compound 130, with pressure port 118 uncovered and unfilled such that membrane 118 can be exposed to the ambient environment.

Figure 6:
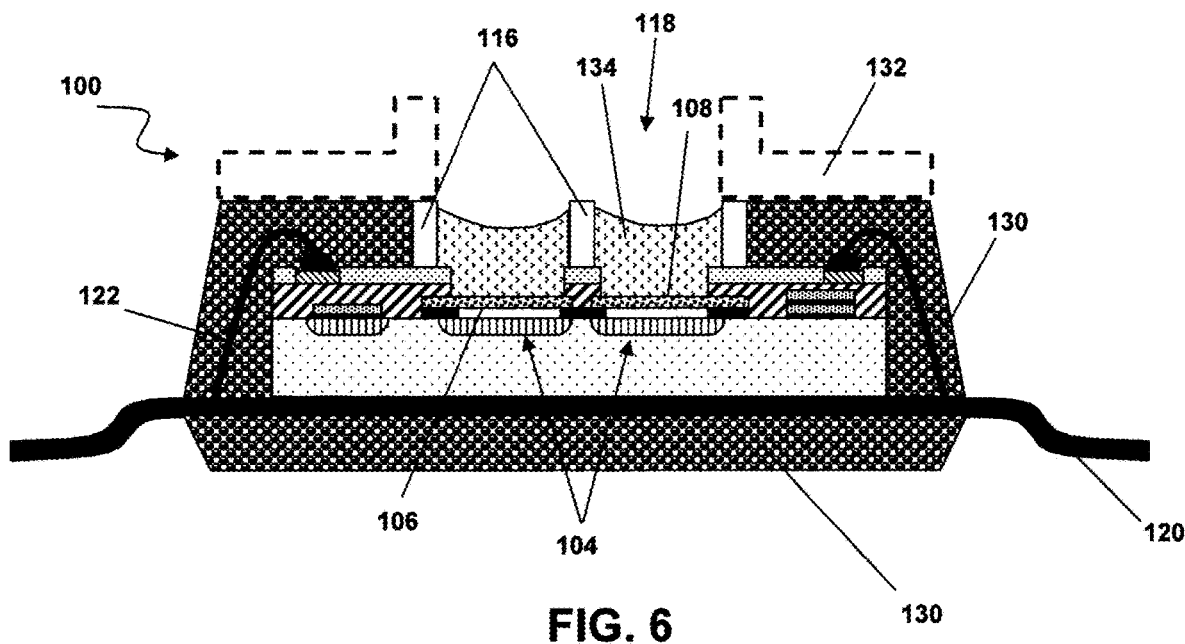
FIG. 6 is a cross-sectional view of an absolute pressure sensor according to an embodiment.

FIG. 6 depicts another embodiment of sensor 100. In the embodiment depicted in FIG. 6, sensor 100 includes an optional package cover 132 and an optional gel 134. Cover 132 can be formed of a typical cover material, for example metal, as understood by one skilled in the art and can be desired according to an application or end use of sensor 100, for example, to create a port for coupling sensor 100 to a pipe or other structure. In an embodiment, optional cover 132 is glued or otherwise suitably affixed to sensor 100. Cover 132 can be omitted, for example, when the application of sensor 100 is to measure barometric pressure, among others.

Optional gel 134 can provide protection of pressure sensing device 104 from external media, mechanical impact and the like. Various embodiments of sensor 100 can comprise one, both or neither of optional cover 132 and optional gel 134. Further, embodiments of sensor 100 having a plurality of pressure sensing devices 104 can include optional gel 134 over some but not all pressure sensing devices 104. In embodiments, frame 116 and predefined pressure port 118 enables the use of frame 116 as a predefined bound for gel 134. In some embodiments, frame 116 can provide separate compartments or areas for gel 134, as depicted in FIG. 6.

Figure 7:
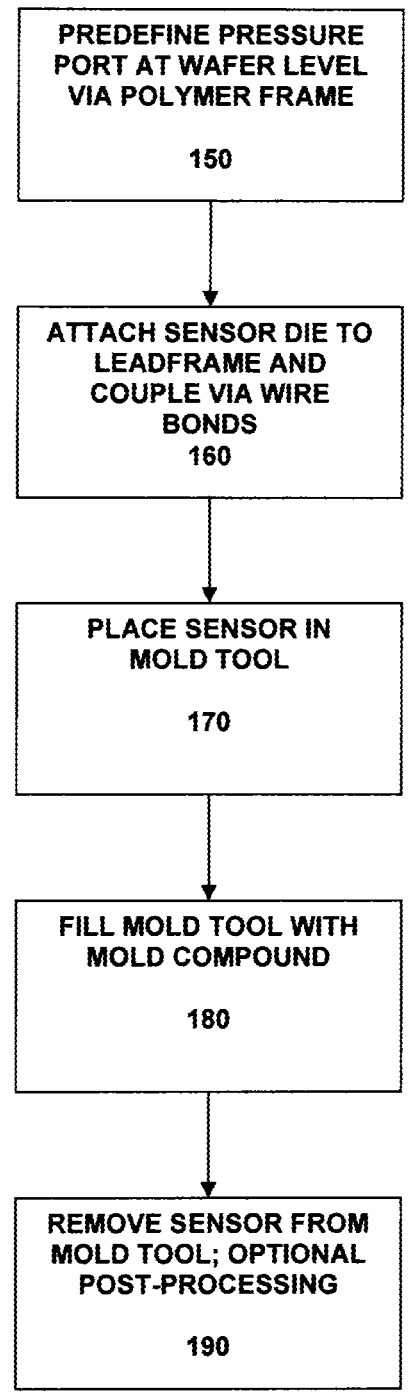
FIG. 7 is a flowchart according to an embodiment.

FIG. 7 is a flowchart of an embodiment of the above-discussed process. At 150, at least one pressure port is defined at wafer level by adding a frame to the sensor. Refer also to FIG. 2. The port need not be a pressure port in every embodiment, however, as the process has applicability to, for example, optical sensors and inertia sensors, among others. At 160, the sensor die is attached to the leadframe and coupled thereto via bond wires or other suitable coupling means. Refer also to FIG. 3. At 170, the sensor is placed in standard mold tool, and at 180 the mold tool is filled with a mold compound. Refer also to FIG. 4. At 190, the sensor is removed from the mold tool, now packaged in the mold compound. Optional post-processing, including placing a protective gel over the sensing membrane and/or adding a package cover, can also be done. Refer also to FIG. 6.

The concept of predefining a sensor port, such as for pressure sensors, optical sensors and other sensors in embodiments, can be flexible and adapted for different wafer technologies. While a surface micro-machining technology can be applicable to the embodiments of FIGS. 1-6, a bulk micro-machining technology can be used in other embodiments. Referring to FIG. 8, another embodiment of a pressure sensor 200 is depicted. Sensor 200 comprises a sensor die 202 having a top wafer 203 and a bottom wafer 205. Top wafer 203 defines a sensor membrane portion 208 and cavity 206, with bottom wafer 205 providing a hermetic seal of cavity 206. Top wafer 203 also includes piezoresistors 207 and bond pads 210. Similar to sensor 100 discussed above, sensor 200 comprises a frame 216 that isolates predefined pressure port 218 during fabrication, enabling use of standard processing and packaging methodologies and mold tools. Packaged in mold compound 230, sensor 200 also comprises leadframe 220 and bond wires 222 and, optionally, package cover 232 and protective gel 234.

Sensor 200 uses a piezoresistive effect to sense pressure. In an embodiment, piezoresistors 207 can measure the stress or strain in sensor membrane portion 208 of top wafer 203. This type of sensor can have applicability in, for example, a tire pressure monitoring system (TPMS), though sensor 200 can also be suitable in other applications and uses. FIG. 8B is a top view of sensor 200 of FIG. 8A, with optional cover 232 and gel 234 omitted.

Figure 8A:
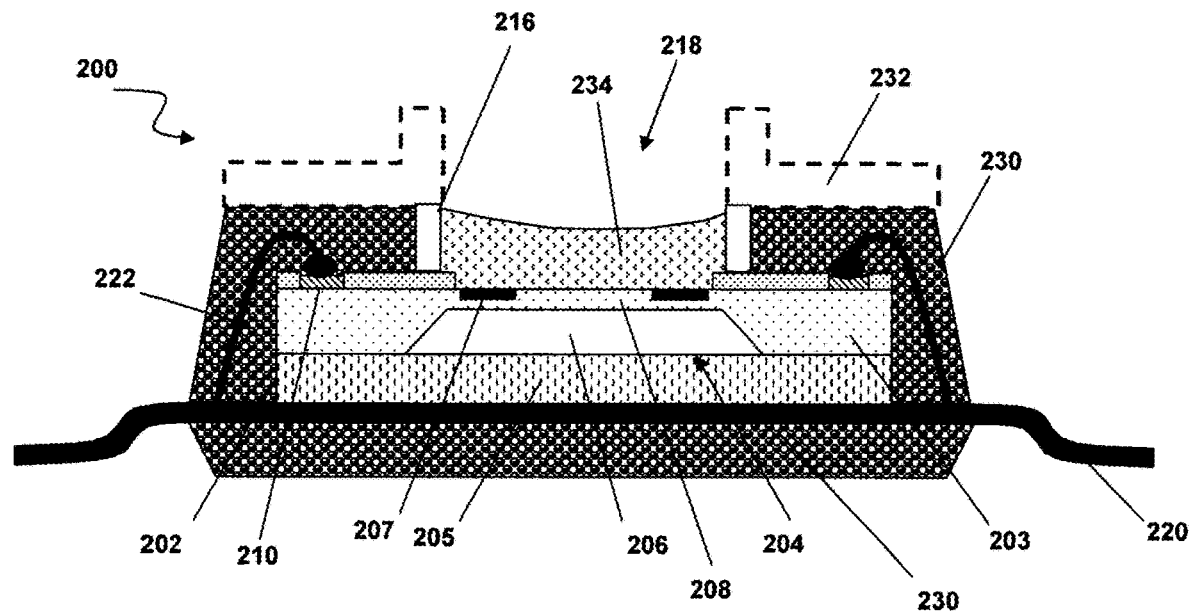
FIG. 8A is a cross-sectional view of an absolute pressure sensor according to an embodiment.
Figure 8B:
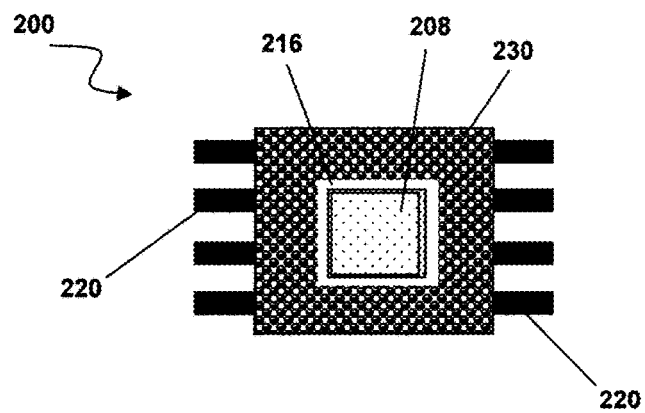
FIG. 8B is a top view of the sensor of FIG. 8A.
Figure 9A:
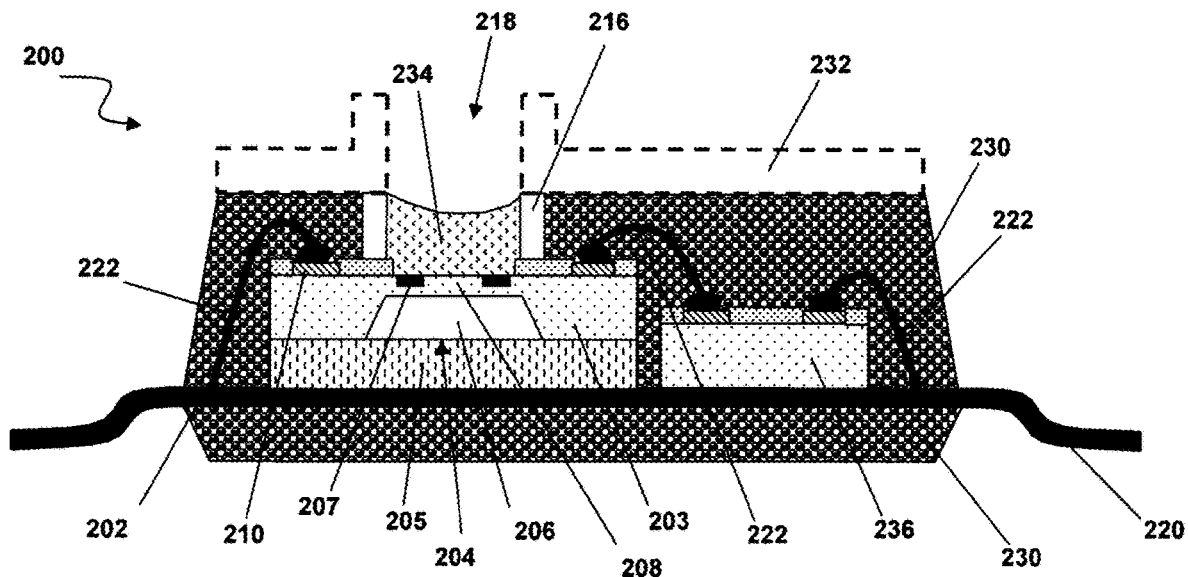
FIG. 9A is a cross-sectional view of an absolute pressure sensor according to an embodiment.
Figure 9B:
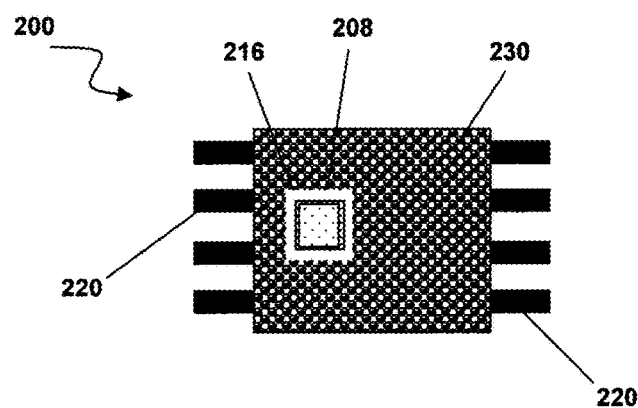
FIG. 9B is a top view of the sensor of FIG. 9A.

The embodiment of sensor 200 depicted in FIGS. 9A and 9B is similar to that of FIGS. 8A and 8B but comprises two chips. In FIGS. 9A and 9B, sensor 200 further comprises an application-specific integrated circuit (ASIC) die 236. ASIC die 230 is attached to leadframe 220 and coupled to die 202 by a bond wire 222. As in other embodiments, cover 232 and gel 234 are optional and omitted from the view of FIG. 9B.

As can be seen in embodiments of sensors 100 and 200 discussed herein, the definition and use of a port predefined at the wafer level of a MEMS sensor device enables use of standardized packaging processes and solutions, avoiding the need for a special mold tool and thereby providing lower-cost solutions while at the same time not interfering with the function or use of the sensor device. Embodiments also provide increased flexibility with respect to wafer technologies and product and application concepts. While sensors 100 and 200 generally relate to absolute pressure sensors, embodiments also have applicability to relative or differential pressure sensing applications.

Figure 10A:
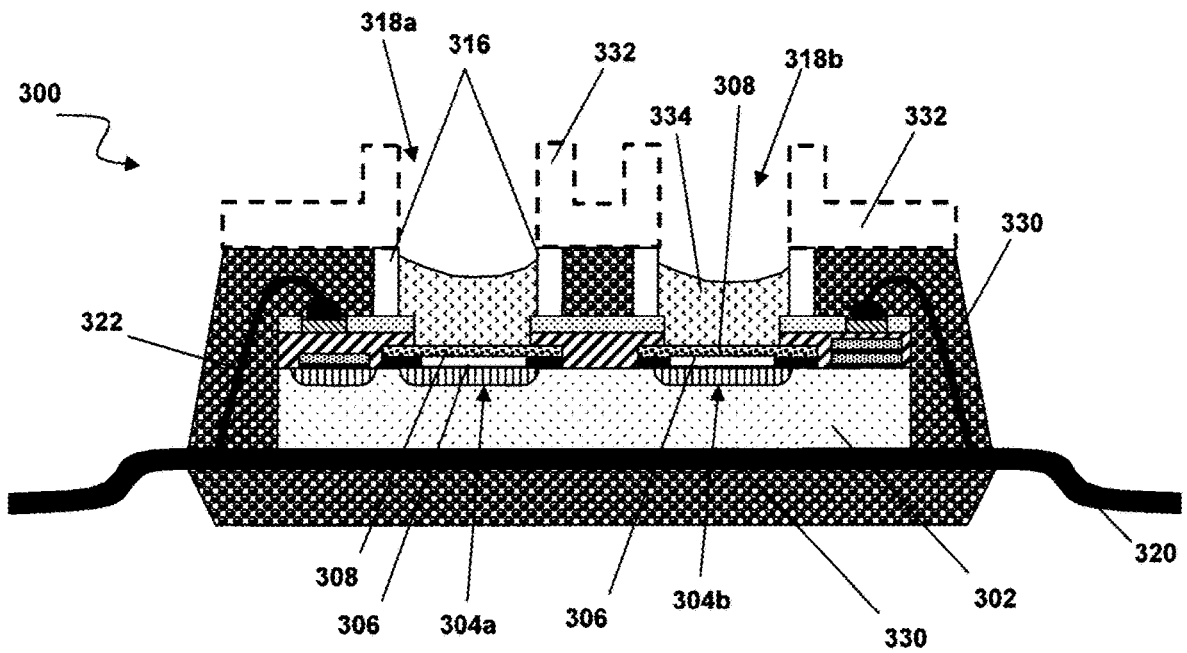
FIG. 10A is a cross-sectional view of a relative pressure sensor according to an embodiment.
Figure 10B:
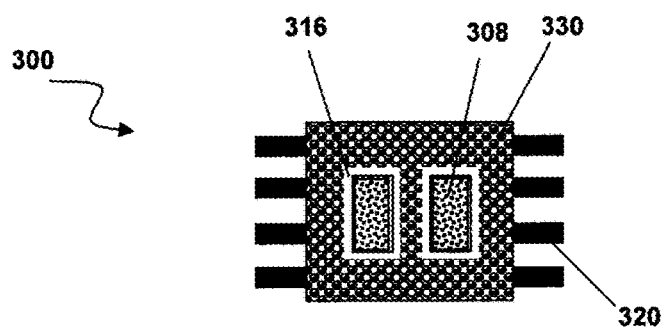
FIG. 10B is a top view of the sensor of FIG. 10A.

Referring to FIG. 10, an embodiment of a relative pressure sensor 300 is depicted. Sensor 300 is similar to sensor 100 of FIG. 6 but configured for relative or differential pressure sensing applications. In particular, sensor 300 comprises at least two predefined pressure ports 318a and 318b and sensing devices 304a and 304b that are sufficiently separated such that relative pressure can be determined, as understood by one having skill in the art. In the embodiment of FIG. 10, sensor 300 can comprise an optional cover 332, which can connect the interfaces of both ports 318a and 318b with the package, providing separately coupleable ports for each of sensing devices 304a and 304b. The top view of sensor 300 in FIG. 10B omits optional gel 334 and package cover 332.

As in other embodiments, sensor 300 comprises a frame 316 that provides a cost-effective way to use standard packaging processes and assembly lines. In the case of relative pressure sensor 300, frame 316 also provides a simple way to form two pressure ports, avoiding the conventional approach of forming a pressure port on each of the front- and back-side of the chip surface. Relative or differential pressure sensor 300 can have applicability, for example, in measuring the pressure drop across a filter, among other applications and uses.

Figure 11A:
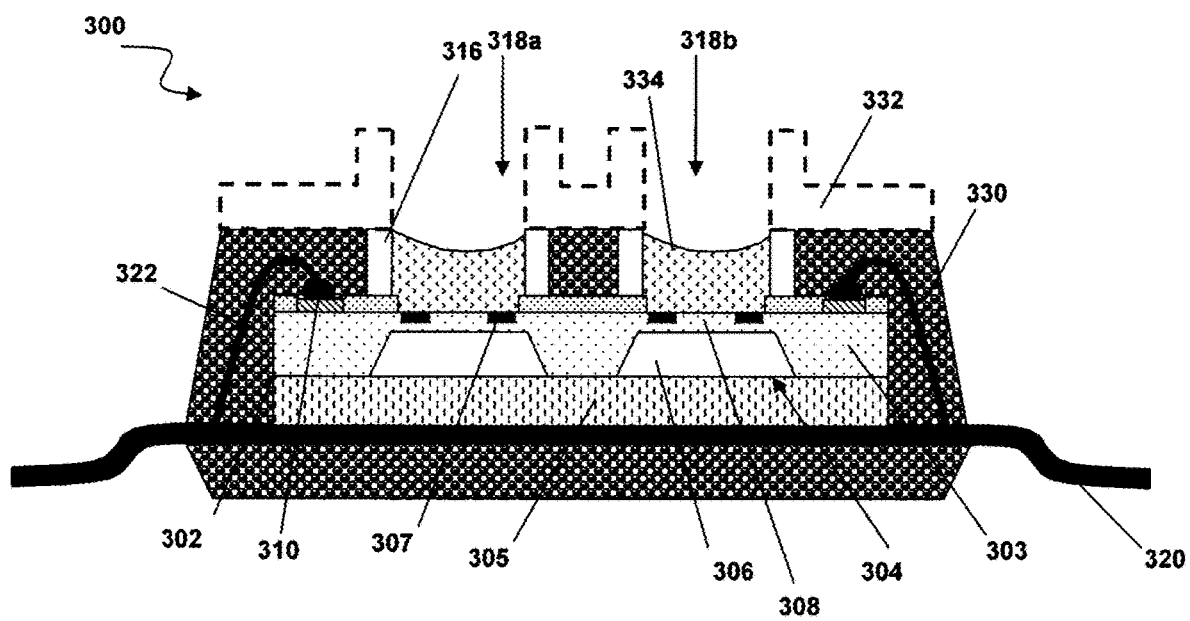
FIG. 11A is a cross-sectional view of a relative pressure sensor according to an embodiment.
Figure 11B:
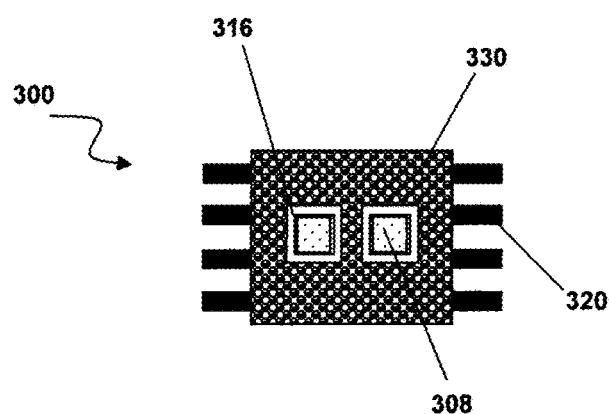
FIG. 11B is a top view of the sensor of FIG. 11A.

Referring to FIG. 11, another embodiment of a relative pressure sensor 300 is depicted. Sensor 300 of FIG. 11 is similar to sensor 300 of FIG. 10, including at least two separated pressure ports 318a and 318b, but differs by comprising piezoresistors 307, similar to sensor 200 of FIG. 8. Similar reference numerals are used herein throughout to refer to similar features in various embodiments, such as here in FIGS. 8 and 11 with the first number differing according to sensor 200 or sensor 300. Cover 332 and gel 334 are, as in other embodiments, optional and are shown in FIG. 11A but omitted from FIG. 11B.

Figure 12A:
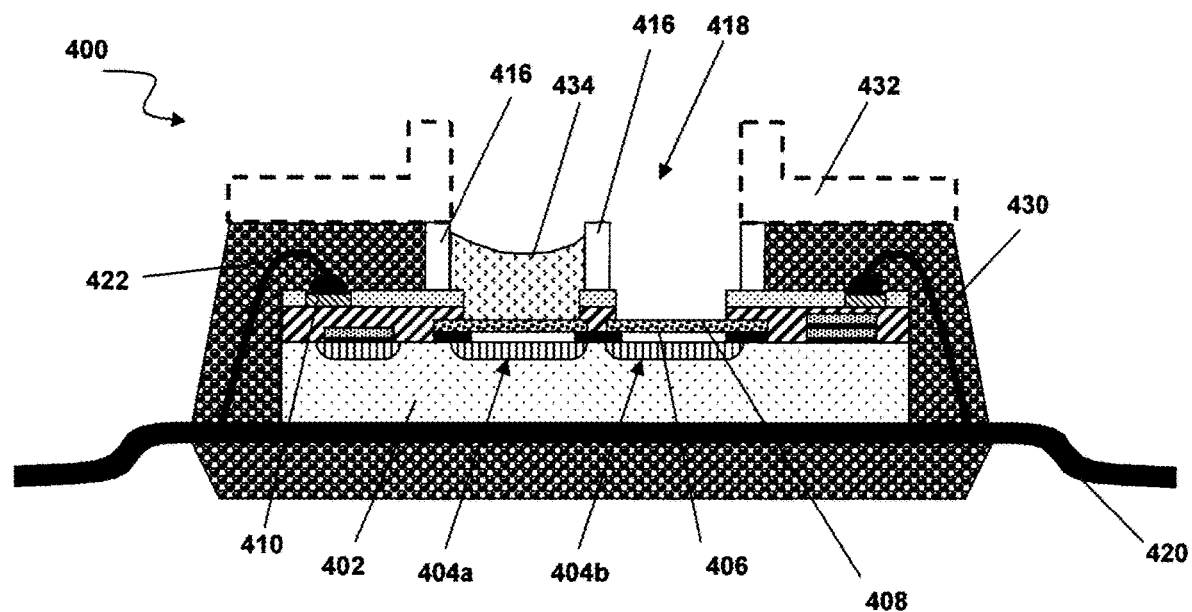
FIG. 12A is a cross-sectional view of an inertial pressure sensor according to an embodiment.
Figure 12B:
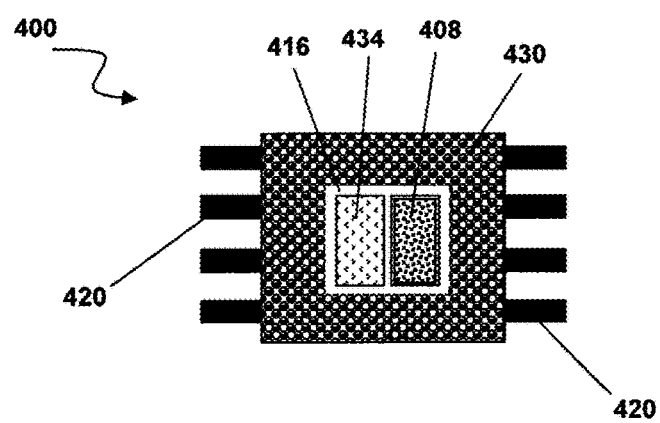
FIG. 12B is a top view of the sensor of FIG. 12A.

Referring to FIG. 12, an embodiment of a packaged inertial sensor 400 having a predefined pressure port is depicted. Inertial sensor 400 comprises a sensor die 402 having at least one pressure sensing device 404. As in other sensor embodiments discussed above, inertial sensor 400 can comprise a plurality of pressure sensing devices 404. Each pressure sensing device 404 includes a cavity 406 and a sensor membrane 408. Sensor die 402 also comprises a plurality of bond pads 410 and can include optional electrical devices, such as transistors 412, resistors and/or capacitors 414 in embodiments. A frame 416 is used to predefine pressure port 418 during the mold compound package forming stages.

In an embodiment, sensor 400 can be configured as an inertial sensor by filling only one side of pressure port 418 with a material, such as a protective gel 434 or other suitable medium. Gel 434 thus covers only one sensing element 404a and acts as an inertial mass, causing an equivalent "inertial" pressure load on sensing element 404a under inertial load. By signal processing the differential signal between the covered (404a) and uncovered (404b) sensor devices, the inertial load can be sensed independently from any applied pressure load. This is due to the fact that in differential mode the load of physical pressure on covered and uncovered devices is equal and thus eliminated by differential signal processing. Only the inertial load leads to a non-zero differential signal because of the different inertial mass on covered and uncovered sensing elements 404a and 404b. The inertial mass and thus the inertial sensor sensitivity of sensor 400 can be adjusted in various embodiments by modifying the type or amount of filling material 434, for example by using a gel with embedded grains of copper or gold to provide a flexible filling material with high mass.

In an embodiment, pressure and inertia sensor features can be combined on a single die by signal processing in differential mode and standard mode with an added signal of covered and uncovered sensor devices, as understood by one skilled in the art. This provides a high degree of flexibility for a multitude of sensor applications and uses with reduced design effort, fabrication complexity and overall device cost.

Embodiments therefore relate to packages and packaging methods for IC sensors. In particular, embodiments can provide standardized and low-cost package solutions for MEMS pressure sensors, improving media compatibility and covering a wider range of sensor applications. Standardized package and packaging methods and processes in the assembly line are made possible at least in part by predefining a pressure port for the pressure sensing element at the wafer-level process before assembly, thereby enabling use of standard package solutions, mold tools and assembly lines and processes. In at least one embodiment, this is accomplished by implementing a frame structure at wafer level that seals a predefined pressure port to a mold tool, preventing the mold compound Other embodiments relate to other types of sensors, including relative or differential pressure sensors, inertia sensors and combinations thereof, such as a single sensor die having both an absolute pressure sensor and an inertia sensor. Further, a plurality of single type of sensor can also be combined in a single sensor device. The flexibility provides applicability to a variety of Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, implantation locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A method for fabricating a micro-electromechanical system (MEMS) device, comprising:
   providing a sensor die having a sensor element;
   forming a membrane on the sensor die to define a cavity, the membrane and cavity forming the sensor element;
   forming a frame around the sensor element to define a port in an interior of the frame, the port exposing the sensor element to an ambient environment;
   forming a thin layer in the port and on the membrane, wherein the membrane is separated and spaced from the frame; and
   enclosing the sensor die with an enclosing material to at least partially enclose the MEMS device, the frame preventing the enclosing material from extending over the frame from an exterior of the frame and into the interior to prevent the enclosing material from entering the port defined in the interior of the frame.

2. The method according to claim 1, wherein the thin layer is a protective gel.

3. The method according to claim 1, further comprising:
   placing the sensor die having the frame formed thereon in an interior of a mold tool;
   adding the enclosing material to the interior of mold tool to enclose the sensor die with the enclosing material; and
   removing the enclosed sensor die from the mold tool to form the MEMS device.

4. The method according to claim 3, wherein the frame contacts an inner surface of the mold tool to seal the frame against the inner surface to prevent the enclosing material from entering the port.

5. The method according to claim 1, further comprising forming a cover on the frame and the enclosing material, the cover having an opening corresponding to the port.

6. The method according to claim 1, wherein forming the frame comprises patterning a polymer material to form the frame and define the port.

7. The method according to claim 1, wherein the sensor element is a pressure sensor to sense a pressure of the ambient environment.

8. The method according to claim 1, further comprising:
   forming at least one bond pad on the sensor die; and
   coupling a leadframe to the sensor die and to the at least one bond pad, wherein the enclosing material encloses the at least one bond pad and the leadframe.

9. The method according to claim 8, wherein the leadframe is coupled to the at least one bond pad by a wire bond.

10. The method according to claim 1, wherein a depth of the port is in a range of 100 micrometers to 500 micrometers.

11. The method according to claim 1, wherein the sensor element comprises a piezoresistive element.

12. The method according to claim 1, wherein the sensor element includes a pressure sensor, an optical sensor, or an inertia sensor.

13. The method according to claim 1, wherein the frame seals off the port during encapsulation to prevent the enclosing material from entering the port.

14. The method according to claim 1, wherein the thin layer is disposed on the membrane.

15. The method according to claim 1, wherein the membrane is separated and spaced from the frame by the thin layer.

16. The method according to claim 1, wherein the membrane is separated and spaced from the enclosing material.

17. A method for fabricating a micro-electromechanical system (MEMS) device, comprising:
   providing a sensor die having a sensor element;
   forming a membrane on the sensor die to define a cavity, the membrane and cavity forming the sensor element;
   forming a frame around the sensor element to define a port configured to expose the sensor element to an ambient environment;
   forming a thin layer in the port and on the membrane, wherein the membrane is separated and spaced from the frame;
   placing the sensor die having the frame formed thereon in an interior of a mold tool;

providing an enclosing material to the interior of the mold tool to at least partially enclose the sensor die having the frame, wherein the frame contacts an inner surface of the mold tool to seal the frame against the inner surface to prevent the enclosing material from entering the port; and removing the enclosed sensor die having the frame from the mold tool to form the MEMS device.

18. The method according to claim 17, further comprising forming a cover on the frame and the enclosing material, the cover having an opening corresponding to the port.

19. The method according to claim 17, further comprising forming a membrane on the sensor die to define a cavity, the membrane and the cavity forming the sensor element.

20. A method for fabricating a micro-electromechanical system (MEMS) device, comprising:
  providing a sensor die having a sensor element;
  forming a membrane on the sensor die to define a cavity, the membrane and cavity forming the sensor element;
  forming a frame around the sensor element to define a port that exposes the sensor element to an ambient environment;
  forming a thin layer in the port and on the membrane, wherein the membrane is separated and spaced from the frame; and
  enclosing the sensor die with an enclosing material to at least partially enclose the MEMS device, wherein the frame completely excludes the enclosing material from the port.

21. The method according to claim 14, wherein the thin layer is a protective gel that is configured to protect the membrane.

* * * * *